US008465692B2

(12) United States Patent
Goel et al.

(10) Patent No.: US 8,465,692 B2
(45) Date of Patent: *Jun. 18, 2013

(54) SODIUM/MOLYBDENUM COMPOSITE METAL ARTICLES AND METHODS FOR PRODUCING METAL ARTICLES

(75) Inventors: Naresh Goel, Sahuarita, AZ (US); Carl Cox, Sahuarita, AZ (US); Dave Honecker, Sahuarita, AZ (US); Eric Smith, Sahuarita, AZ (US); Chris Michaluk, Sahuarita, AZ (US); Adam DeBoskey, Sahuarita, AZ (US); Sunil Chandra Jha, Oro Valley, AZ (US)

(73) Assignee: Climax Engineered Materials, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/038,578

(22) Filed: Mar. 2, 2011

(65) Prior Publication Data
US 2011/0147208 A1 Jun. 23, 2011

Related U.S. Application Data

(62) Division of application No. 12/013,263, filed on Jan. 11, 2008.

(51) Int. Cl.
*B22F 3/16* (2006.01)
(52) U.S. Cl.
USPC .................................. 419/42; 419/58; 419/68
(58) Field of Classification Search
USPC ............... 75/245, 338, 351; 148/513; 419/32, 419/34, 38, 49, 66, 68; 420/429; 423/53
See application file for complete search history.

(56) References Cited

U.S. PATENT DOCUMENTS

| 3,617,358 | A * | 11/1971 | Dittrich | 427/447 |
|---|---|---|---|---|
| 2006/0042728 | A1 * | 3/2006 | Lemon et al. | 148/668 |
| 2006/0062926 | A1 * | 3/2006 | Richardson et al. | 427/440 |
| 2006/0219056 | A1 * | 10/2006 | Larink | 75/338 |

OTHER PUBLICATIONS

B.L. Ferguson and R.M. German, "Powder Shaping and Consolidation Technologies", in ASM Handbook, vol. 7: Powder Metal Technologies and Applications, ASM International, 1998, (313-320), Pages in NPL: 1 of 16; 14 of 16 to 16 of 16; 1 of 5 to 5 of 5; and 1 of 1.*
"Production Sintering Practices", in ASM Handbook, vol. 7: Powder Metal Technologies and Appplications, ASM International, 1998, .(468-503),Pages in NPL, 1 of 16, 14 of 16 to 16 of 16, 1 of 6 to 6 of 6.*
R.A. Haber and C.A. Paredes, "Slip Casting of Metals: Process Considerations: Slip Control," Shaping and Consolidation Technologies, vol. 7, Powder Metal Technologies and Applications, ASM Handbook, ASM International, 1998.*

* cited by examiner

*Primary Examiner* — Scott Kastler
*Assistant Examiner* — Vanessa Luk
(74) *Attorney, Agent, or Firm* — Fennemore Craig, P.C.

(57) ABSTRACT

A method for producing a metal article may include: Producing a supply of a composite metal powder by: providing a supply of molybdenum metal powder; providing a supply of a sodium compound; combining the molybdenum metal powder and the sodium compound with a liquid to form a slurry; feeding the slurry into a stream of hot gas; and recovering the composite metal powder; and consolidating the composite metal powder to form the metal article, the metal article comprising a sodium/molybdenum metal matrix. Also disclosed is a metal article produced accordance with this method.

16 Claims, 5 Drawing Sheets

SODIUM/MOLYBDENUM COMPOSITE METAL ARTICLES AND METHODS FOR PRODUCING METAL ARTICLES

CROSS-REFERENCE TO RELATED APPLICATION

This is a divisional of co-pending U.S. patent application Ser. No. 12/013,263, filed Jan. 11, 2008, which is hereby incorporated herein by reference for all that it discloses.

TECHNICAL FIELD

This invention relates molybdenum-containing materials and coatings in general and more specifically to molybdenum coatings suitable for use in the manufacture of photovoltaic cells.

BACKGROUND

Molybdenum coatings are well-known in the art and may be applied by a variety of processes in a wide variety of applications. One application for molybdenum coatings is in the production of photovoltaic cells. More specifically, one type of high-efficiency polycrystalline thin film photovoltaic cell involves an absorber layer comprising $CuInGaSe_2$. Such photovoltaic cells are commonly referred to as "CIGS" photovoltaic cells after the elements comprising the absorber layer. In a common construction, the $CuInGaSe_2$ absorber layer is formed or "grown" on a soda-lime glass substrate having a molybdenum film deposited thereon. Interestingly, it has been discovered that small quantities of sodium from the soda-lime glass substrate diffusing through the molybdenum film serve to increase the efficiency of the cell. See, for example, K. Ramanathan et al., Photovolt. Res. Appl. 11 (2003), 225; John H. Scofield et al., Proc. of the 24th IEEE Photovoltaic Specialists Conference, IEEE, New York, 1995, 164-167. While such efficiency gains are automatically realized in structures wherein the CIGS cell is deposited on soda-lime glass substrates, it has proven considerably more difficult to realize efficiency gains where other types of substrates are used.

For example, there is considerable interest in forming CIGS cells on flexible substrates so that the cells may be made lighter and may be readily conformed to a variety of shapes. While such cells have been made and are being used, the flexible substrates involved do not contain sodium. Consequently, the performance of CIGS cells manufactured on such substrates may be improved by doping the molybdenum layer with sodium. See, for example, Jae Ho Yun et al., Thin Solid Films, 515, 2007, 5876-5879.

SUMMARY OF THE INVENTION

A method for producing a metal article according to one embodiment of the invention may include: Producing a supply of a composite metal powder by: providing a supply of molybdenum metal powder; providing a supply of a sodium compound; combining the molybdenum metal powder and the sodium compound with a liquid to form a slurry; feeding the slurry into a stream of hot gas; and recovering the composite metal powder; and consolidating the composite metal powder to form the metal article, the metal article comprising a sodium/molybdenum metal matrix. Also disclosed is a metal article produced accordance with this method.

Also disclosed is a method for producing a composite metal powder that involves: Providing a supply of molybdenum metal powder; providing a supply of a sodium compound; combining the molybdenum metal powder and the sodium compound with a liquid to form a slurry; feeding the slurry into a stream of hot gas; and recovering the composite metal powder. Also disclosed is a composite metal powder produced according to this process.

Another embodiment for producing a composite metal powder may include: Providing a supply of molybdenum metal powder; providing a supply of a sodium molybdate powder; combining the molybdenum metal powder and the sodium molybdate powder with water to form a slurry; feeding the slurry into a stream of hot gas; and recovering the composite metal powder. Also disclosed is a composite metal powder produced in accordance with this process.

A method for producing a photovoltaic cell in accordance with the teachings provided herein may include: Providing a substrate; depositing a sodium/molybdenum metal layer on the substrate; depositing an absorber layer on the sodium/molybdenum metal layer; and depositing a junction partner layer on the absorber layer.

A method for depositing a sodium/molybdenum film on a substrate may involve: Providing a supply of a composite metal powder comprising molybdenum and sodium; and depositing the composite metal powder on the substrate by thermal spraying. Another method for depositing a film on a substrate may comprise: Sputtering a target comprising a sodium/molybdenum metal matrix, sputtered material from the target forming the sodium/molybdenum film. Another method for coating a substrate may include: Providing a supply of composite metal powder comprising molybdenum and sodium; and evaporating the composited metal powder to form a sodium/molybdenum film. A method for coating a substrate may include: Providing a supply of a composite metal powder comprising molybdenum and sodium; mixing the supply of composite metal powder with a vehicle, and depositing the mixture of the composite metal powder and the vehicle on the substrate by printing.

BRIEF DESCRIPTION OF THE DRAWINGS

Illustrative and presently preferred exemplary embodiments of the invention are shown in the drawings in which.

DETAILED DESCRIPTION OF THE PREFERRED EMBODIMENTS

Figure 1:
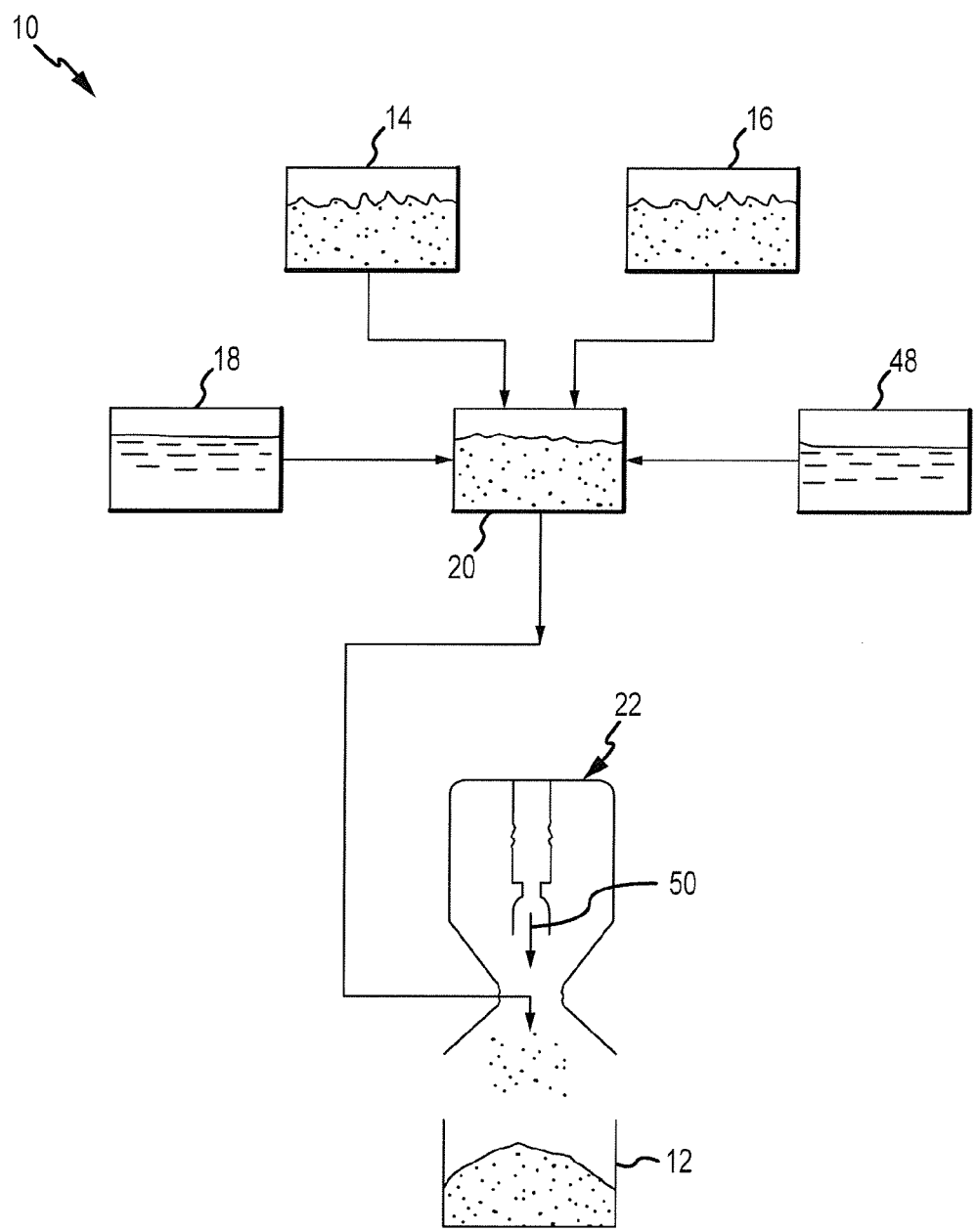
FIG. 1 is a schematic representation of one embodiment of basic process steps which may be utilized to produce a sodium/molybdenum composite metal powder.

A process or method 10 for producing a sodium/molybdenum composite metal powder 12 is illustrated in FIG. 1 and, briefly described, may comprise a supply of a molybdenum metal powder 14 and a supply of a sodium compound 16, such as, for example, sodium molybdate ($Na_2MoO_4$) powder. The molybdenum metal powder 14 and sodium molybdate powder 16 are combined with a liquid 18, such as water, to form a slurry 20. The slurry 20 may then be spray dried, e.g., by a pulse combustion spray dryer 22, in order to produce the sodium/molybdenum composite metal powder 12.

Figure 2:
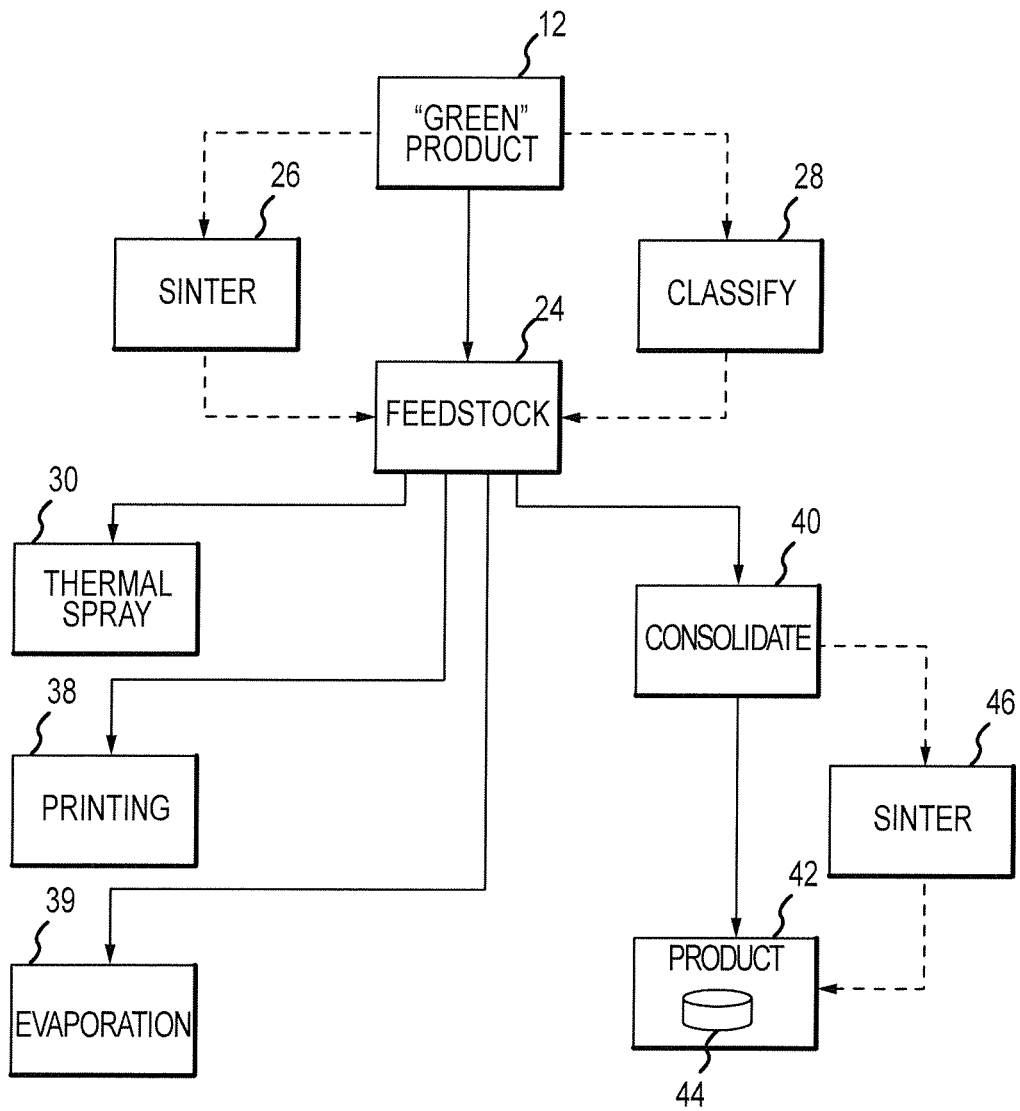
FIG. 2 is a process flow chart depicting methods for processing the composite metal powder mixture.
Figure 3:
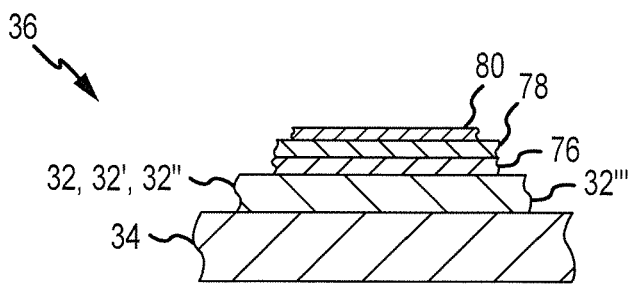
FIG. 3 is a enlarged cross-section in elevation of a photovoltaic cell having a sodium/molybdenum metal layer.

Referring now primarily to FIG. 2, the sodium/molybdenum composite metal powder 12 may be used in its as-recovered or "green" form as a feedstock 24 for a variety of processes and applications, many of which are shown and described herein, and others of which will become apparent to persons having ordinary skill in the art after having become familiar with the teachings provided herein. Alternatively, the "green" composite metal powder 12 may be further processed, e.g., by sintering 26, by classification 28, or combinations thereof, before being used as feedstock 24. The sodium/molybdenum composite metal powder feedstock 24 (e.g., in either the "green" form or in the processed form) may be used in a thermal spray deposition process 30 in order to deposit a sodium/molybdenum film 32 on a substrate 34, as best seen in FIG. 3. Such sodium/molybdenum films 32 may be used to advantage in a wide variety of applications. For example, and as will be described in further detail below, the sodium/molybdenum film 32 may comprise a portion of a photovoltaic cell 36 and may be used to improve the efficiency of the photovoltaic cell 36. In an alternate deposition process, the composite metal powder 12 may also be used as a feedstock 24 in a printing process 38 which may also be used to form a sodium/molybdenum film or coating 32' on substrate 34.

In still yet another embodiment, the composite metal powder feedstock 24, again in either its "green" form or in its processed form, may be consolidated at step 40 in order to produce a metal product 42, such as a sputter target 44. The metal product 42 may be used "as is" directly from consolidation 40. Alternatively, the consolidated product may be further processed, e.g., by sintering 46, in which case the metal product 42 will comprise a sintered metal product. In the case where the metal product 42 comprises a sputter target 44 (i.e., in either a sintered form or an un-sintered form), the sputter target 44 may be used in a sputter deposition apparatus (not shown) in order to deposit a sodium/molybdenum film 32" on substrate 34. See FIG. 3.

Figure 4:
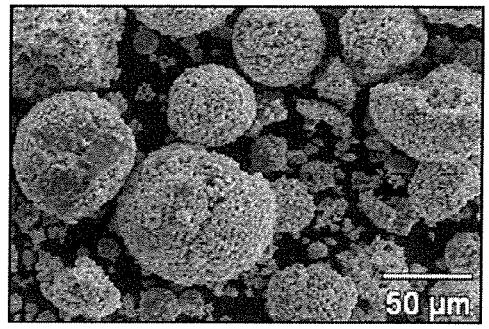
FIG. 4 is a scanning electron microscope image of a sodium/molybdenum composite metal powder mixture.
Figure 5A:
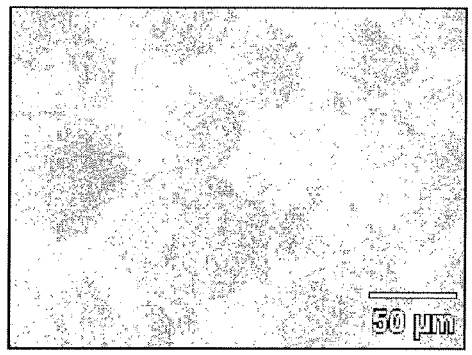
FIG. 5a is a spectral map produced by energy dispersive x-ray spectroscopy showing the dispersion of sodium in the image of FIG. 4.
Figure 5B:
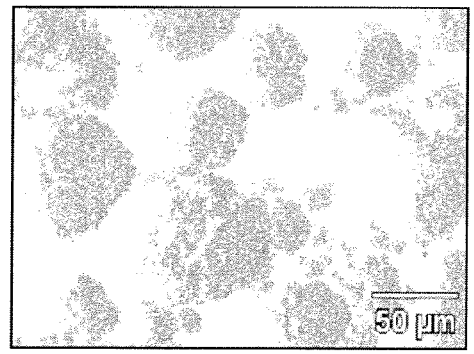
FIG. 5b is a spectral map produced by energy dispersive x-ray spectroscopy showing the dispersion of molybdenum in the image of FIG. 4.

Referring now primarily to FIGS. 4, 5a, and 5b, the sodium/molybdenum composite metal powder 12 comprises a plurality of generally spherically-shaped particles that are themselves agglomerations of smaller particles. Accordingly, the composite metal powder 12 may be characterized herein in the alternative as "soccer balls" formed of "BB's." Moreover, and as is evidenced by FIGS. 5a and 5b, the sodium is highly dispersed within the molybdenum. That is, the sodium/molybdenum composite powders of the present invention are not mere combinations of sodium metal powders and molybdenum metal powders, but rather comprise substantially homogeneous dispersions or composite mixtures of sodium and molybdenum sub-particles that are fused or agglomerated together. The sodium/molybdenum metal powder composite is also of high density and possesses favorable flow characteristics. As will be discussed in further detail herein, exemplary sodium/molybdenum composite metal powders 12 produced in accordance with the teachings provided herein may have Scott densities in a range of about 2 g/cc to about 3 g/cc. Hall flowabilities range from less than about 35 s/50 g to as low as 30 s/50 g for the various example compositions shown and described herein.

A significant advantage of the present invention is that it provides a metallic combination of molybdenum and sodium that is otherwise difficult or impossible to achieve by conventional methods. Moreover, even though the sodium/molybdenum composite metal powder comprises a powdered material, it is not a mere mixture of sodium and molybdenum particles. Instead, the sodium and molybdenum sub-particles are actually fused together, so that individual particles of the powdered metal product comprise both sodium and molybdenum. Accordingly, powdered feedstocks 24 comprising the sodium/molybdenum composite powders according to the present invention will not separate (e.g., due to specific gravity differences) into sodium particles and molybdenum particles. Furthermore, coatings or films produced from the sodium/molybdenum composite metal powders will have compositions that are similar to the compositions of the sodium/molybdenum metal powders since such deposition processes do not rely on the co-deposition of separate molybdenum and sodium particles that would each have different deposition rates.

Besides the advantages associated with the ability to provide a composite metal powder wherein sodium is highly and evenly dispersed throughout molybdenum, the composite metal powders disclosed herein are also characterized by high densities and flowabilities, thereby allowing the composite metal powders to be used to advantage in a wide variety of power metallurgy processes that are now known in the art or that may be developed in the future. For example, the sodium molybdenum composite metal powders may be readily used in a wide variety of thermal spray deposition apparatus and associated processes to deposit sodium/molybdenum films or coatings on various substrates. The powders may also be readily used in a wide variety of consolidation processes, such as cold and hot isostatic pressing processes as well as pressing and sintering processes. The high flowability allows the powders disclosed herein to readily fill mold cavities, whereas the high densities minimizes shrinkage that may occur during subsequent sintering. Sintering can be accomplished by heating in an inert atmosphere or in hydrogen to further reduce oxygen content of the compact.

In another embodiment, the sodium/molybdenum composite metal powders may be used to form sputter targets, which may then be used in subsequent sputter deposition processes to form sodium/molybdenum films and coatings. In one embodiment, such sodium/molybdenum films may used to increase the energy conversion efficiencies of photovoltaic cells.

Having briefly described the sodium/molybdenum composite metal powders 12 of the present invention, methods for producing them, and how they may be used to produce sodium/molybdenum coatings or films on substrates, various embodiments of the composite powders, as well as methods for producing and using the composite powders will now be described in detail.

Referring back now primarily to FIG. 1, a method 10 for producing sodium/molybdenum composite powders 12 may comprise a supply of molybdenum metal powder 14 and a supply of a sodium compound 16. The molybdenum metal power 14 may comprise a molybdenum metal powder having a particle size in a range of about 0.1 μm to about 15 μm, although molybdenum metal powders 14 having other sizes may also be used. Molybdenum metal powders suitable for use in the present invention are commercially available from Climax Molybdenum, a Freeport-McMoRan Company, and from Climax Molybdenum Company, a Freeport-McMoRan Company, Ft. Madison Operations, Ft. Madison, Iowa (US). Alternatively, molybdenum metal powders from other sources may be used as well.

The sodium compound 16 may comprise sodium molybdate, either in its anhydrous form (i.e., $Na_2MoO_4$) or as the dihydrate (i.e., $Na_2MoO_4.2H_2O$), although other sodium-containing materials including, but not limited to elemental sodium, $Na_2O$, and $Na(OH)$, may be used. Sodium molybdate is usually available in powder form and may comprise any of a wide range of sizes. The particle size of the sodium molybdate powder 16 is not particularly critical in embodiments wherein water is used as the liquid 18, because sodium molybdate is soluable in water. Sodium molybdate powders suitable for use in the present invention are commercially available from Climax Molybdenum, a Freeport-McMoRan Company, Ft. Madison Operations, of Ft. Madison, Iowa (US). Alternatively, sodium molybdate may be obtained from other sources.

The molybdenum metal powder 14 and sodium molybdate 16 may be mixed with a liquid 18 to form a slurry 20. Generally speaking, the liquid 18 may comprise deionized water, although other liquids, such as alcohols, volatile liquids, organic liquids, and various mixtures thereof, may also be used, as would become apparent to persons having ordinary skill in the art after having become familiar with the teachings provided herein. Consequently, the present invention should not be regarded as limited to the particular liquids 18 described herein. In addition to the liquid 18, a binder 48 may be used as well, although the addition of a binder 48 is not required. Binders 48 suitable for use in the present invention include, but are not limited to, polyvinyl alcohol (PVA), Carbowax, and mixtures thereof. The binder 48 may be mixed with the liquid 18 before adding the molybdenum metal powder 14 and the sodium molybdate 16. Alternatively, the binder 48 could be added to the slurry 20, i.e., after the molybdenum metal 14 and sodium molybdate 16 have been combined with liquid 18.

The slurry 20 may comprise from about 15% to about 25% by weight liquid (e.g., either liquid 18 alone, or liquid 18 combined with binder 48), with the balance comprising the molybdenum metal powder 14 and the sodium compound 16. The sodium compound 16 (e.g., sodium molybdate) may be added in amounts suitable to provide the composite metal powder 12 and/or final product with the desired amount of "retained" sodium. Because the amount of retained sodium will vary depending on a wide range of factors, the present invention should not be regarded as limited to the provision of the sodium compound 16 in any particular amounts. Factors that may affect the amount of sodium compound 16 that is to be provided in slurry 20 include, but are not limited to, the particular product that is to be produced, the particular "downstream" processes that may be employed, e.g., depending on whether the sodium/molybdenum composite metal powder 12 is sintered, and on whether the desired quantity of retained sodium is to be in the powder feedstock (e.g., 24) or in a deposited film or coating (e.g., 32, 32', 32"). However, by way of example, the mixture of molybdenum metal 14 and sodium molybdate 16 may comprise from about 1% by weight to about 15% by weight sodium molybdate 18. Overall, then, slurry 20 may comprise from about 0% by weight (i.e., no binder) to about 2% by weight binder 48. The balance of slurry 20 may comprise molybdenum metal powder 14 (e.g., in amounts ranging from about 58% by weight to about 84% by weight) and sodium molybdate 16 (e.g., in amounts ranging from about 1% by weight to about 15% by weight).

Slurry 22 may then be spray dried by any of a wide range of processes that are now known in the art or that may be developed in the future in order to produce the composite metal powder product 12, as would become apparent to persons having ordinary skill in the art after having become familiar with the teachings provided herein. Consequently, the present invention should not be regarded as limited to any particular drying process. However, by way of example, in one embodiment, the slurry 20 is spray dried in a pulse combustion spray dryer 22. More specifically, pulse combustion spray dryer 22 may be of the type shown and described in U.S. Patent Application Publication No. US 2006/0219056, of Larink, Jr., entitled "Metal Powders and Methods for Producing the Same," which is specifically incorporated herein by reference for all that it discloses.

Figure 6:
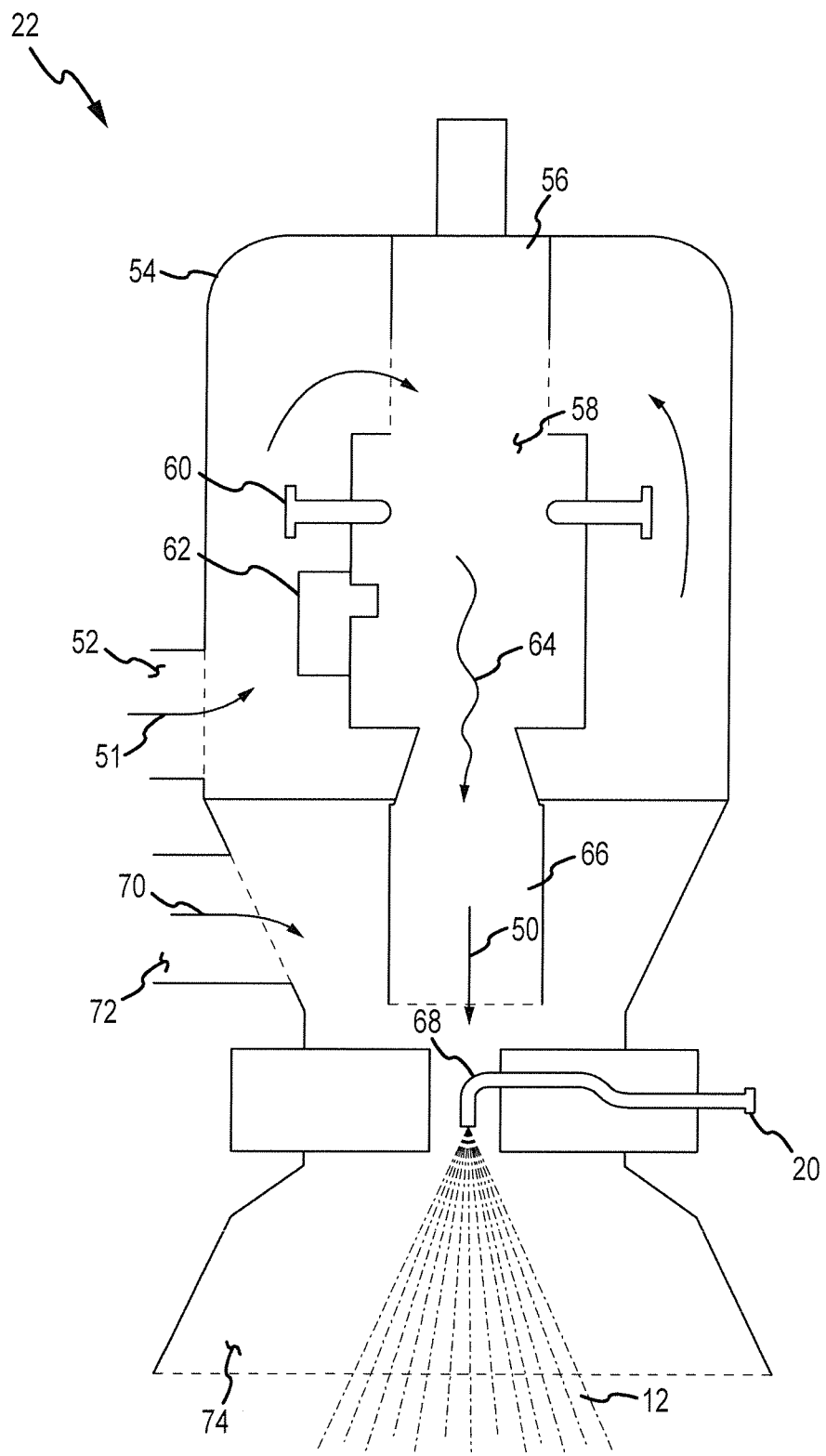
FIG. 6 is a schematic representation of one embodiment of pulse combustion spray dry apparatus.

Referring now to FIGS. 1 and 6, slurry 20 may be fed into pulse combustion spray dryer 22, whereupon slurry 20 impinges a stream of hot gas (or gases) 50, which are pulsed at or near sonic speeds. The sonic pulses of hot gas 50 contact the slurry 20 and drive-off substantially all of the water and form the composite metal powder product 12. The temperature of the pulsating stream of hot gas 50 may be in a range of about 300° C. to about 800° C., such as about 465° C. to about 537° C., and more preferably about 500° C. Generally speaking, the temperature of the pulsating stream of hot gas 50 is below the melting point of the slurry constituents, but not below the melting point of elemental sodium. However, the slurry 20 is usually not in contact with the hot gases 50 long enough to transfer a significant amount of heat to the slurry 20, which is significant because of the low melting point of sodium metal. For example, in a typical embodiment, it is estimated that the slurry 20 is generally heated to a temperature in the range of about 93° C. to about 121° C. during contact with the pulsating stream of hot gas 50.

As mentioned above, the pulsating stream of hot gas 50 may be produced by a pulse combustion system 22 of the type that is well-known in the art and readily commercially available. By way of example, in one embodiment, the pulse combustion system 22 may comprise a pulse combustion system of the type shown and described in U.S. Patent Application Publication No. 2006/0219056. Referring now to FIG. 6, combustion air 51 may be fed (e.g., pumped) through an inlet 52 into the outer shell 54 of the pulse combustion system 22 at low pressure, whereupon it flows through a unidirectional air valve 56. The air then enters a tuned combustion chamber 58 where fuel is added via fuel valves or ports 60. The fuel-air mixture is then ignited by a pilot 62, creating a pulsating stream of hot combustion gases 64 which may be pressurized to a variety of pressures, e.g., in a range of about 15,000 Pa (about 2.2 psi) to about 20,000 Pa (about 3 psi) above the combustion fan pressure. The pulsating stream of hot combustion gases 64 rushes down tailpipe 66 toward the atomizer 68. Just above the atomizer 68, quench air 70 may be fed through an inlet 72 and may be blended with the hot combustion gases 64 in order to attain a pulsating stream of hot gases 50 having the desired temperature. The slurry 20 is introduced into the pulsating stream of hot gases 50 via the atomizer 68. The atomized slurry may then disperse in the conical outlet 74 and thereafter enter a conventional tall-form drying chamber (not shown). Further downstream, the composite metal powder product 12 may be recovered using standard collection equipment, such as cyclones and/or baghouses (also not shown).

In pulsed operation, the air valve 56 is cycled open and closed to alternately let air into the combustion chamber 58 and close for the combustion thereof. In such cycling, the air valve 56 may be reopened for a subsequent pulse just after the previous combustion episode. The reopening then allows a subsequent air charge (e.g., combustion air 51) to enter. The fuel valve 60 then re-admits fuel, and the mixture auto-ignites in the combustion chamber 58, as described above. This cycle of opening and closing the air valve 56 and combusting the fuel in the chamber 58 in a pulsing fashion may be controllable at various frequencies, e.g., from about 80 Hz to about 110 Hz, although other frequencies may also be used.

The "green" sodium/molybdenum composite metal powder product 12 produced by the pulse combustion spray drying process described herein is illustrated in FIGS. 4, 5a, and 5b, and comprises a plurality of generally spherically-shaped particles that are themselves agglomerations of smaller particles. As already described, the sodium is highly dispersed within the molybdenum, comprising a substantially homogeneous dispersion or composite mixture of sodium and molybdenum sub-particles that are fused together. More specifically, FIG. 5a is a spectral map produced by energy dispersive x-ray spectroscopy ("EDS") that illustrates the presence of sodium within the sample of the composite metal material 12 that is shown in FIG. 4. FIG. 5b is a spectral map produced by energy dispersive x-ray spectroscopy that shows the presence of molybdenum within the sample. As can be seen by comparing FIGS. 4 and 5a and 5b, the sodium is generally evenly and widely dispersed throughout the composite metal powder product 12.

Figure 7:
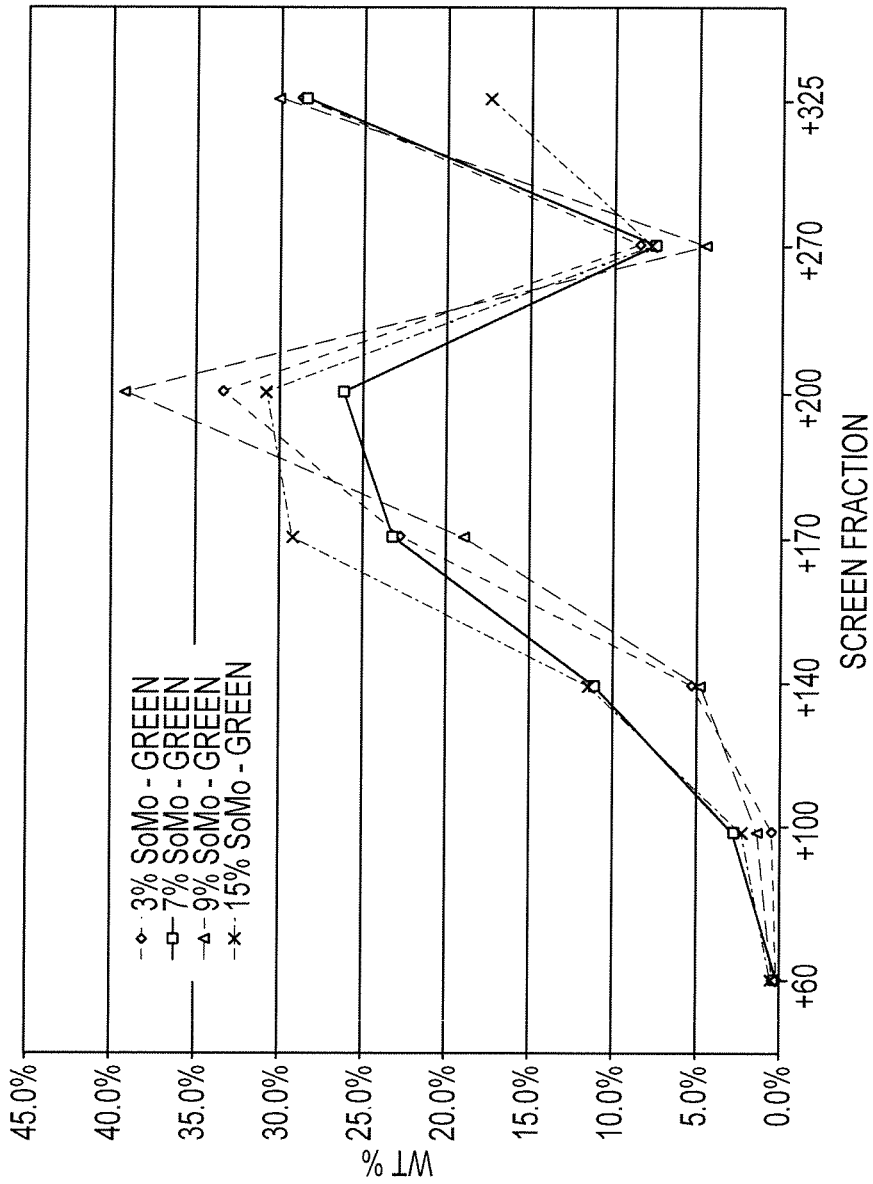
FIG. 7 is a plot showing the screen fraction distributions of exemplary composite metal powders produced in accordance with the teachings provided herein.

Generally speaking, the composite metal powder product 12 produced in accordance with the teachings provided herein will comprise a wide range of sizes, and particles having sizes ranging from about 1 μm to about 100 μm, such as, for example, sizes ranging from about 5 μm to about 45 μm and from about 45 μm to about 90 μm, can be readily produced by the following the teachings provided herein. The composite metal powder product 12 may be classified e.g., at step 28 (FIG. 2), if desired, to provide a product 12 having a more narrow size range. Sieve analyses of various exemplary composite metal powder products 12 are provided in FIG. 7, which is a plot of the particle size distributions (by U.S. Tyler mesh) of the "green" composite metal powder product 12 produced by slurry compositions comprising 3, 7, 9, and 15% by weight sodium molybdate 18.

As mentioned above, the sodium/molybdenum composite metal powder 12 is also of high density and is generally quite flowable. Exemplary composite metal powder products 12 have Scott densities (i.e., apparent densities) in a range of about 2 g/cc to about 3 g/cc, as identified in the various Examples set forth herein. Hall flowabilities range from about 35 s/50 g to as low as 30 s/50 g, again as identified in the various Examples set forth herein. One example composition (i.e., Example 12) had no flow, however.

As already described, the pulse combustion system 22 provides a pulsating stream of hot gases 50 into which is fed the slurry 20. The contact zone and contact time are very short, the time of contact often being on the order of a fraction of a microsecond. Thus, the physical interactions of hot gas 50, sonic waves, and slurry 20 produces the composite metal powder product 12. More specifically, the liquid component 18 of slurry 20 is substantially removed or driven away by the sonic (or near sonic) pulse waves of hot gas 50. The short contact time also ensures that the slurry components are minimally heated, e.g., to levels on the order of about 93° C. to about 121° C. at the end of the contact time, temperatures which are sufficient to evaporate the liquid component 18.

In certain instances, residual amounts of liquid (e.g., liquid 18 and/or binder 48, if used) may remain in the resulting "green" composite metal powder product 12. Any remaining liquid may be driven-off (e.g., partially or entirely), by a subsequent sintering or heating step 26. See FIG. 2. Generally speaking, the heating or sintering process 26 is conducted at a moderate temperatures in order to drive off the liquid components and oxygen, but not substantial quantities of sodium. Some sodium may be lost during heating 26, which will reduce the amount of retained sodium in the sintered or feedstock product 24. It is also generally preferred, but not required, to conduct the heating 26 in a hydrogen atmosphere in order to minimize oxidation of the composite metal powder 12. Retained oxygen is low, less than about 6%, and generally less than about 2%, as indicated in the Examples provided below. Heating 26 may be conducted at temperatures within a range of about 500° C. to about 825° C. Alternatively, temperatures as high as 1050° C. may be used for short periods of time. However, such higher temperatures will usually reduce the amount of retained sodium in the final product.

It may also be noted that the agglomerations of the metal powder product preferably retain their shapes (in many cases, though not necessarily, substantially spherical), even after the heating step 26. Flowability data (Hall data) in heated and/or green forms are also generally very good (e.g., in a range of about 30-35 s/50 g), as described relative to the Examples provided herein.

As noted above, in some instances a variety of sizes of agglomerated products may be produced during the drying process, and it may be desirable to further separate or classify the composite metal powder product 12 into a metal powder product having a size range within a desired product size range. For example, most of the composite metal powder material produced will comprise particle sizes in a wide range (e.g., from about 1 μm to about 150 μm), with a substantial amount of product being in the range of about 5 μm to about 45 μm (i.e., −325 U.S. Tyler mesh) and again in the range of about 45 μm to 90 μm (i.e., −170+325 U.S. Tyler mesh). See FIG. 7. A process hereof may yield a substantial percentage of product in this product size range; however, there may be remainder products, particularly the smaller products, outside the desired product size range which may be recycled through the system, though liquid (e.g., water) would again have to be added to create an appropriate slurry composition. Such recycling is an optional alternative (or additional) step or steps.

The composite metal powder 12 may be used in its as-recovered or "green" form as a feedstock 24 for a variety of processes and applications, several of which are shown and described herein, and others of which will become apparent to persons having ordinary skill in the art after having become familiar with the teachings provided herein. Alternatively, the "green" composite metal powder product 12 may be further processed, such as, for example, by heating or sintering 26, by classification 28, and/or combinations thereof, before being used as feedstock 24.

As mentioned above, the sodium/molybdenum composite metal powder 12 may be used in various apparatus and processes to deposit sodium/molybdenum films on substrates. In one application, such sodium/molybdenum films can be used to advantage in the fabrication of photovoltaic cells. For example, it is known that the energy conversion efficiency of a CIGS photovoltaic cell can be increased if sodium is allowed to diffuse into the molybdenum layer typically used to form an ohmic contact of the photovoltaic cell. Such efficiency gains are automatically realized in GIGS structures wherein the molybdenum ohmic contact is deposited on a soda-glass substrate. However, they are not realized in structures wherein soda-glass is not used as a substrate.

Referring now to FIG. 3, a photovoltaic cell 36 may comprise a substrate 34 on which a sodium/molybdenum film 32, 32', 32" may be deposited. The substrate 34 may comprise any of a wide range of substrates such as, for example, stainless steel, flexible poly films, or other substrate materials now known in the art or that may be developed in the future that are, or would be, suitable for such devices. A sodium/molybdenum film 32, 32', 32" may then be deposited on the substrate 34 by any of a wide range of processes now known in the art or that may be developed in the future, but utilizing in some form the sodium/molybdenum composite metal powder material 12. For example, and as will be described in further detail below, the sodium/molybdenum film may be deposited by thermal spray deposition, by printing, by evaporation, or by sputtering.

Once the sodium/molybdenum film (e.g., 32, 32', 32") is deposited on substrate 34, an absorber layer 76 may be deposited on the sodium/molybdenum film. By way of example, the absorber layer 76 may comprise one or more selected from the group consisting of copper, indium, and selenium. The absorber layer 76 may be deposited by any of a wide range of methods known in the art or that may be developed in the future that are, or would be, suitable for the intended application. Consequently, the present invention should not be regarded as limited to any particular deposition process.

Next, a junction partner layer 78 may be deposited on the absorber layer 76. Junction partner layer 78 may comprise one or more selected from the group consisting of cadmium sulfide and zinc sulfide. Finally, a transparent conductive oxide layer 80 may be deposited on junction partner layer 78 to form the photovoltaic cell 36. Junction partner layer 78 and transparent conductive oxide layer 80 may be deposited by any of a wide range processes and methods now known in the art or that may be developed in the future that are, or would be, suitable for depositing these materials. Consequently, the present invention should not be regarded as limited to any particular deposition process. In addition, because processes for fabricating CIGS photovoltaic cells are known in the art (with the exception of providing the sodium/molybdenum film on the substrate) and could be readily implemented by persons having ordinary skill in the art after having become familiar with the teachings of the present invention, the particular fabrication techniques that may be utilized to construct a CIGS photovoltaic cell will not be described in further detail herein.

As mentioned above, the sodium/molybdenum layer or film 32, 32', 32" may be deposited by any of a wide range of processes. Generally speaking, it is believed that sodium concentrations of about 1% by weight will be sufficient to provide the desired efficiency enhancements. Accordingly, the retained sodium present in the feedstock material 24 may be adjusted or varied as necessary in order to provide the desired level of sodium in the resulting sodium/molybdenum film 32. Generally speaking, retained sodium levels ranging from about 0.2% by weight to about 3.5% by weight in the feedstock material 24 will be sufficient to provide the desired degree of sodium enrichment in the sodium/molybdenum film 32. As indicated in the Examples, such retained sodium levels (e.g., from about 0.2 wt. % to about 3.5 wt. %) may be achieved in "green" and sintered (i.e., heated) feedstock material 24 produced by slurries 20 containing from about 3 wt. % to about 15 wt. % sodium molybdate.

In one embodiment, a sodium/molybdenum film 32 may be deposited by a thermal spray process 30 utilizing the feedstock material 24. Thermal spray process 30 may be accomplished by using any of a wide variety of thermal spray guns and operated in accordance with any of a wide range of parameters in order to deposit on substrate 34 a sodium/molybdenum film 32 having the desired thickness and properties. However, because thermal spray processes are well known in the art and because persons having ordinary skill in the art would be capable of utilizing such processes after having become familiar with the teachings provided herein, the particular thermal spray process 30 that may be utilized will not be described in further detail herein.

In another embodiment, a sodium/molybdenum film 32' may be deposited on substrate 34 by a printing process 38 utilizing the feedstock material 24. Feedstock material 24 may be mixed with a suitable vehicle (not shown) to form an "ink" or "paint" that may then be deposited on substrate 34 by any of a wide range of printing processes. Here again, because such printing processes are well known in the art and could be readily implemented by persons having ordinary skill in the art after having become familiar with the teachings provided herein, the particular printing process 38 that may be utilized will not be described in further detail herein.

In still another embodiment, a sodium/molybdenum film 32" may be deposited on substrate 34 by an evaporation process 39 utilizing the feedstock material 24. By way of example, in one embodiment, evaporation process 39 would involve placing the feedstock material 24 in a crucible (not shown) of a suitable evaporation apparatus (also not shown). The feedstock material 24 could be placed in the crucible either in the form of a loose powder, pressed pellets, or other consolidated forms, or in any combination thereof. The feedstock material 24 would the be heated in the crucible until it evaporates, whereupon the evaporated material would be deposited on substrate 34, forming the sodium/molybdenum film 32". Evaporation process 39 may utilize any of a wide range of evaporation apparatus now known in the art or that may be developed in the future that could be used to evaporate the feedstock material 24 and deposit film 32" on substrate 34. Consequently, the present invention should not be regarded as limited to use with any particular evaporation apparatus operated in accordance with any particular parameters. Moreover, because such evaporation apparatus are well known in the art and could be readily implemented by persons having ordinary skill in the art after having become familiar with the teachings provided herein, the particular evaporation apparatus that may be utilized will not be described in further detail herein.

In yet another embodiment, a sodium/molybdenum film 32' may be deposited on substrate 34 by a sputter deposition process. The feedstock material 24 would be processed or formed into a sputter target 44, which would then be sputtered in order to form the film 32'". Any of a wide range of sputter deposition apparatus that are now known in the art or that may be developed in the future could be used to sputter deposit film 32'" on substrate 34. Consequently, the present invention should not be regarded as limited to use with any particular sputter deposition apparatus operated in accordance with any particular parameters. Moreover, because such sputter deposition apparatus are well known in the art and could be readily implemented by persons having ordinary skill in the art after having become familiar with the teachings provided herein, the particular sputter deposition apparatus that may be utilized will not be described in further detail herein.

As mentioned, the sputter target 44 may comprise a metal product 42 that may be fabricated by consolidating or forming the sodium/molybdenum composite metal powder 12 at step 40. Alternatively, the sputter target 44 could be formed by thermal spraying 30. If the sputter target 44 is to be fabricated by consolidation 40, the feedstock material 24, in either its "green" form or processed form, may be consolidated or formed in step 40 to produce the metal product (e.g., sputter target 44). The consolidation process 40 may comprise any of a wide range of compaction, pressing, and forming processes now known in the art or that may be developed in the future that would be suitable for the particular application. Consequently, the present invention should not be regarded as limited to any particular consolidation process.

By way of example, the consolidation process 40 may comprise any of a wide range of cold isostatic pressing processes or any of a wide range of hot isostatic pressing processes that are well-known in the art. As is known, both cold and hot isostatic pressing processes generally involve the application of considerable pressure and heat (in the case of hot isostatic pressing) in order to consolidate or form the composite metal powder feedstock material 24 into the desired shape. Hot isostatic pressing processes may be conducted at temperatures of 900° C. or greater, depending on the green density of the sodium/molybdenum composite metal powder compact and the retained sodium loss that could be tolerated in the final product.

After consolidation 40, the resulting metal product 42 (e.g., sputter target 44) may be used "as is" or may be further processed. For example, the metal product 42 may be heated or sintered at step 46 in order to further increase the density of the metal product 42. It may be desirable to conduct such a heating process 46 in a hydrogen atmosphere in order to minimize the likelihood that the metal product 42 will become oxidized. Generally speaking, it will be preferred to conduct such heating at temperatures below about 825° C. as higher temperatures may result in substantial reductions in the amount of retained sodium, although higher temperatures (e.g., temperatures of 1050° C. or greater) could be used. The resulting metal product 42 may also be machined if necessary or desired before being placed in service. Such machining could be done regardless of whether the final product 42 was sintered.

EXAMPLES

Several examples have been run using molybdenum metal and sodium molybdate powders 14, 16, specified herein and available from Climax Molybdenum and/or Climax Molybdenum, Ft. Madison Operations. Various ratios of the powders 14 and 16 were combined with deionized water to form the slurries 20. More specifically, the slurries 20 utilized for the various examples comprised about 20% by weight water (i.e., liquid 18), with the remainder being molybdenum metal and sodium molybdate powders. The ratio of molybdenum metal powder to sodium molybdate was varied in the various examples to range from about 3% by weight to about 15% by weight sodium molybdate. More specifically, the Examples involved amounts of 3, 7, 9, and 15 weight percent sodium molybdate.

The slurries 20 were then fed into the pulse combustion spray drying system 22 in the manner described herein. The temperature of the pulsating stream of hot gases 50 was controlled to be within a range of about 465° C. to about 537° C. The pulsating stream of hot gases 50 produced by the pulse combustion system 22 substantially drove-off the water from the slurry 20 to form the composite metal powder product 12. The contact zone and contact time were very short, the contact zone on the order of about 5.1 cm and the time of contact being on the order of 0.2 microseconds.

The resulting metal powder product 12 comprised agglomerations of smaller particles that were substantially solid (i.e., not hollow) and having generally spherical shapes. An SEM photo of a "green" sodium/molybdenum composite metal powder produced by a slurry 20 comprising 9% by weight sodium molybdate is presented in FIG. 4. Data in Tables I and II are presented for the various examples in both "green" form, and after being sintered or heated in a hydrogen atmosphere at the temperatures and for the times specified. Data are also presented for screened green material (+325 mesh moly) as also indicated in Tables I and II.

TABLE I

| Example | Batch | Molybdenum metal (wt %) | Sodium Molybdate (SoMo) (wt %) | Apparent Density (g/cc) | Hall flow (s/50 g) |
|---|---|---|---|---|---|
| 1 | 3% SoMo Green | 97% | 3% | | |
| 2 | 7% SoMo Green | 93% | 7% | 2.89 | 33 |
| 3 | 9% SoMo Green | 91% | 9% | | |
| 4 | 15% SoMo Green | 85% | 15% | | |
| 5 | 3% SoMo + 325 mesh | 97% | 3% | | |
| 6 | 9% SoMo + 325 mesh | 91% | 9% | | |
| 7 | 15% SoMo + 325 mesh | 85% | 15% | | |
| 8 | 9% SoMo Sintered 1 h. 1050° C. | 91% | 9% | | |
| 9 | 7% SoMo Sintered 10 h. 640° C. | 93% | 7% | 2.79 | 32 |
| 10 | 9% SoMo Sintered 10 h. 640° C. | 91% | 9% | | |
| 11 | 3% SoMo Sintered 6 h. 825° C. | 97% | 3% | | |
| 12 | 9% SoMo Sintered 6 h. 825° C. | 91% | 9% | 2.62 | No Flow |
| 13 | 15% SoMo Sintered 6 h. 825° C. | 85% | 15% | | |

TABLE II

| Example | Slurry Viscosity Sec. Zahn#1 | Sodium Conc. (wt. %) | % O | % N | % Weight loss during Sintering | Na Distribution (EDS) |
|---|---|---|---|---|---|---|
| 1 | 33.8 | 0.74% | 1.23% | 0.0020% | | |
| 2 | | 1.39% | 2.14% | 0.2500% | | |
| 3 | 35 | 1.74% | 2.64% | 0.0075% | | Na varies in |

TABLE II-continued

| Example | Slurry Viscosity Sec. Zahn#1 | Sodium Conc. (wt. %) | % O | % N | % Weight loss during Sintering | Na Distribution (EDS) |
|---|---|---|---|---|---|---|
| | | | | | | particles from 3% to 12% |
| 4 | | 3.11% | 5.58% | 0.0295% | | |
| 5 | | | 1.22% | 0.0016% | | |
| 6 | | 1.84% | 2.93% | 0.0101% | | No Na peak found by EDS |
| 7 | | 3.09% | 5.16% | 0.196% | | |
| 8 | | 0.73% | | | | No Na peak found by EDS |
| 9 | | 1.36% | 1.36% | 0.0000% | 0.97% | |
| 10 | | 1.85% | 1.85% | 0.0018% | 1.85% | 4% |
| 11 | | 0.22% | 0.22% | 0.0011% | 1.79% | |
| 12 | | 1.32% | 1.32% | 0.0010% | 3.90% | 1.86% |
| 13 | | 2.39% | 2.39% | 0.0015% | 4.84% | 2.89% |

Having herein set forth preferred embodiments of the present invention, it is anticipated that suitable modifications can be made thereto which will nonetheless remain within the scope of the invention. The invention shall therefore only be construed in accordance with the following claims:

The invention claimed is:

1. A method of producing a metal article, comprising: producing a supply of a composite metal powder by:
    providing a supply of molybdenum metal powder;
    providing a supply of sodium molybdate;
    combining said molybdenum metal powder and said sodium molybdate with a liquid to form a slurry, said sodium molybdate being added to said molybdenum metal powder in an amount comprising from about 3% by weight to about 15% by weight sodium molybdate before being combined with said liquid;
    feeding said slurry into a stream of hot gas to produce the composite metal powder; and
    recovering the composite metal powder, said composite metal powder comprising from about 0.2% by weight to about 3.5% by weight retained sodium; and
consolidating said composite metal powder to form the metal article, said metal article comprising a sodium/molybdenum metal matrix.

2. The method of claim 1, wherein said consolidating said composite metal powder comprises cold isostatic pressing.

3. The method of claim 1, wherein consolidating comprises pressing said composite metal powder into a shape and sintering the shape.

4. The method of claim 3, wherein said sintering is conducted in a hydrogen atmosphere.

5. The method of claim 4, wherein said sintering is conducted at a temperature of less than about 825° C.

6. The method of claim 1, wherein consolidating comprises hot isostatic pressing.

7. The method of claim 6, wherein said hot isostatic pressing is conducted at a temperature of at least about 900° C.

8. The method of claim 7, further comprising sintering the metal article after said consolidating.

9. The method of claim 8, wherein said sintering is conducted at a temperature of less than about 825° C.

10. A method of producing a metal article, comprising:
    providing a supply of a sodium/molybdenum composite metal powder comprising a substantially homogeneous dispersion of sodium and molybdenum sub-particles that are fused together to form individual particles of said composite metal powder, said sodium/molybdenum composite metal powder comprising from about 0.2% by weight to about 3.5% by weight retained sodium; and
    consolidating said sodium/molybdenum composite metal powder to form said metal article, said metal article comprising a sodium/molybdenum metal matrix.

11. The method of claim 10, wherein said consolidating said sodium/molybdenum composite metal powder comprises one or more selected from the group consisting of cold isostatic pressing and hot isostatic pressing.

12. The method of claim 10, wherein said consolidating said sodium/molybdenum composite metal powder comprises pressing said composite metal powder into a shape and sintering the shape.

13. The method of claim 12, wherein said sintering is conducted in a hydrogen atmosphere.

14. The method of claim 13, wherein said sintering is conducted at a temperature of less than about 825° C.

15. The method of claim 10, wherein the oxygen content of said metal article is less than or equal to about 6% by weight.

16. The method of claim 10, wherein said metal article comprises a sputter target.

* * * * *